United States Patent [19]
Crowley et al.

[11] Patent Number: 5,767,675
[45] Date of Patent: Jun. 16, 1998

[54] MIXED TIMING CPMG SEQUENCE FOR REMOTELY POSITIONED MRI

[75] Inventors: Christopher W. Crowley, San Diego; Freeman H. Rose, Jr., Del Mar, both of Calif.

[73] Assignee: Panacea Medical Laboratories, Carlsbad, Calif.

[21] Appl. No.: 655,805

[22] Filed: May 31, 1996

[51] Int. Cl.$^6$ .................................................. G01V 3/00
[52] U.S. Cl. ................................. 324/309; 324/307
[58] Field of Search .......................... 324/309, 307, 324/306, 312, 300; 128/653.2

[56] References Cited

U.S. PATENT DOCUMENTS

| | | |
|---|---|---|
| 4,296,378 | 10/1981 | King . |
| 4,379,262 | 4/1983 | Young . |
| 4,471,306 | 9/1984 | Edelstein et al. . |
| 4,521,733 | 6/1985 | Bottomley et al. . |
| 4,656,425 | 4/1987 | Bendel . |
| 4,684,891 | 8/1987 | Feinberg . |
| 4,893,081 | 1/1990 | Zur . |
| 5,167,232 | 12/1992 | Parker et al. . |
| 5,229,717 | 7/1993 | Hinks . |
| 5,241,271 | 8/1993 | Taguchi et al. . |
| 5,260,656 | 11/1993 | Cory . |
| 5,304,930 | 4/1994 | Crowley et al. . |
| 5,493,225 | 2/1996 | Crowley et al. ............. 324/309 |
| 5,497,088 | 3/1996 | Hayano et al. ............... 324/309 |
| 5,517,118 | 5/1996 | Crowley et al. . |
| 5,565,777 | 10/1996 | Kanayama et al. ........... 324/309 |
| 5,655,531 | 8/1997 | Nishimura et al. ........... 324/309 |

FOREIGN PATENT DOCUMENTS 0 526 983 A1  10/1993  European Pat. Off. .

OTHER PUBLICATIONS

*Spin–Iversion Imaging: A Technique for NMR Imaging Under Magnetic Fields with High Field Nonuiformities*, Tak Sum Wong and Dov Rosenfeld, IEEE Transactions on Medical Imaging, vol. MI–6, No. 2, Jun. 1987.

*Echo Projection Imaging—A Method to Obtain NMR Images Undistorted by Magnetic Field Inhomogeneities*, Peter Bendel IEEE Transactions on Medical Imaging, vol. MI–4, No. 2, Jun. 1985.

*Primary Examiner*—Louis M. Arana
*Attorney, Agent, or Firm*—Nydegger & Associates

[57] ABSTRACT

A method for maintaining encoded coherence for a remotely positioned MRI device is accomplished in groups of pulses. Each group includes four sequences of pulses and each sequence includes a tilting phase, an encoding phase and a recording phase. Specifically, each sequence begins with a 90° tilting pulse. The encoding phase, which follows, is characterized by a time interval between refocusing 180° pulses which is of sufficient duration to permit effective encoding of the material to be imaged. On the other hand, the recording phase, which follows the encoding phase, is characterized by a time interval between refocusing 180° pulses which is shorter in duration in order to maintain encoded coherence during imaging. Within any group of pulses, there are four individually different sequences which result by shifting the phases of the refocusing pulses from sequence to sequence to provide $180°_{\pm x}$ and $180°_{\pm y}$ refocusing pulses.

19 Claims, 3 Drawing Sheets

MIXED TIMING CPMG SEQUENCE FOR REMOTELY POSITIONED MRI

FIELD OF THE INVENTION

The present invention pertains generally to remotely positioned MRI devices. More specifically, the present invention pertains to a method for maintaining encoded coherence for a remotely positioned MRI device. The present invention is particularly, but not exclusively, useful as a method for operating a remotely positioned MRI device with differential refocusing to establish a time interval wherein encoding of the material to be imaged is enhanced.

BACKGROUND OF THE INVENTION

Magnetic resonance imaging (MRI) is a well known procedure whereby the internal tissue of a living organism can be non-invasively imaged. Basically, MRI involves placing the tissue to be imaged in a magnetic field, tilting the tissue nuclei with a radio frequency (RF) pulse, and then recording echo signals from the tilted nuclei. Several interactive factors, of course, are involved. Specifically, the homogeneity of the magnetic field, or the lack thereof, can have important consequences. This is so due to the effect the magnetic field has on the tissue nuclei.

MRI devices which incorporate homogeneous magnetic fields are quite popular and are used because of the speed and quality with which they can produce images. MRI devices with homogeneous magnetic fields, however, tend to be bulky and require magnets which at least partially surround the tissue area to be imaged. On the other hand, MRI devices which rely on nonhomogeneous magnetic fields can remain external to the tissue area to be imaged. Furthermore, they are generally smaller, less bulky and more mobile. The present invention is concerned specifically with MRI devices which use nonhomogeneous magnetic fields. Accordingly, the peculiar aspects and characteristics of nonhomogeneous magnetic fields need to be considered.

One of the more important aspects of a nonhomogeneous magnetic field, at least insofar as MRI is concerned, is the presence of an inherently dominant field gradient, denoted ($G_z$). This field gradient $G_z$ acts in a direction (z) that is substantially perpendicular to surfaces of constant field magnitude (denoted $B_o$), and represents the rate of change in magnitude of the magnetic field at the location of a nucleus. It will be noted that in a homogeneous magnetic field, $G_z=0$. When the field gradient $G_z$ does not equal zero, however, a potentially adverse effect is that it causes tilted nuclei to behave erratically. More specifically, it is known that $G_z$ influences: 1) the rate at which nuclei defocus (and, thus, the rate at which they can be refocused); 2) the mechanism of signal to noise ratio (SNR); and 3) the diffusion of nuclei as they defocus.

With the above in mind, MRI procedures are perhaps best understood by considering that an MRI procedure involves three distinct functions. These are: 1) a "tilting" function which initially alters the energy state of nuclei in the magnetic field so they will generate signals that are characteristic of the nuclei; 2) an "encoding" function wherein field gradients are selectively imposed on the nuclei so that they can be subsequently identified; and 3) a "recording" function wherein recordable spin echo signals from the encoded nuclei are gathered for use in conventional imaging and reconstruction techniques. For the present invention, these functions need to be considered in the context of a nonhomogeneous magnetic field.

New MRI techniques for dealing with some of the unique aspects of a nonhomogeneous magnetic field are disclosed in U.S. Pat. No. 5,304,930 which issued to Crowley et al. for an invention entitled "Remotely Positioned MRI System", and which is assigned to the same assignee as the present invention. In particular, one technique disclosed in U.S. Pat. No. 5,304,930 involves maintaining coherence by accelerated refocusing of the nuclei after they have been tilted. This technique evolved from a recognition by Crowley et al. that the rate of defocus/refocus for nuclei in a nonhomogeneous magnetic field is proportional to the magnitude of the field gradient $G_z$. While this technique is effective for facilitating the recording function of an MRI procedure, it turns out that the accelerated refocusing rate allows for very little time in which to encode the nuclei.

In light of the above, it is an object of the present invention to provide a method for maintaining encoded coherence for a remotely positioned MRI device which allows sufficient time for effective encoding of nuclei. It is another object of the present invention to provide a method for maintaining encoded coherence for a remotely positioned MRI device which provides for both an effective encoding phase and an accelerated refocusing of encoded nuclei to enable enhanced image construction. Still another object of the present invention is to provide a method for maintaining encoded coherence for a remotely positioned MRI device that is relatively easy to execute and comparatively cost effective.

SUMMARY OF THE INVENTION

In accordance with the present invention, a method for using a remotely positioned MRI device to image tissue material is accomplished in groups of pulses. Each group includes four sequences, and each sequence includes three functional phases. Specifically, the first functional phase in each sequence is the "tilting" phase wherein the tissue nuclei to be imaged are tilted by a 90° pulse of RF radiation. The second and third phases, which follow, use 180° pulses rather that 90° pulses. In the second phase of a sequence, which is the "encoding" phase, the time interval between refocusing 180° pulses is established to be of sufficient duration to allow for an effective encoding of the material. In the third phase of a sequence, which is the "recording" phase, the time interval between 180° refocusing pulses is significantly shortened in order to increase the signal acquisition rate. It is the duration of the time intervals between pulses in the different phases of a sequence and the transition from one phase to another in each sequence that is of particular importance for maintaining coherence of the encoded nuclear magnetic moments during their measurements.

To perform a sequence in accordance with the methods of the present invention, the nuclear magnetic moments of the material to be imaged are first tilted by a 90° pulse. This is done at time $t_0$. There is then a pause from time $t_0$ until a time $t_1$ which covers a time interval of $\tau_1$. For purposes of the present invention the time interval $\tau_1$ is in the range of approximately one half millisecond to ten milliseconds.

The encoding phase of a sequence begins at time $t_1$ with an initial 180° refocusing pulse. After this initial 180° refocusing pulse, the material is encoded with an x gradient and a y gradient. Encoding continues from time $t_1$ to a time $t_2$ through a time interval that is equal to $2\tau_1$. This encoding phase then ends at time $t_2$ with another 180° refocusing pulse.

It happens that due to the nonhomogeneous nature of the magnetic field a more rapid refocusing of the material with 180° pulses is required during the recording (third) phase than was required during the encoding (second) phase. More specifically, whereas the time interval between 180° refocusing pulses in the encoding phase is $2\tau_1$, the time interval between 180° refocusing pulses in the recording phase is $2\tau_2$. For the present invention, $\tau_2$ is much shorter than $\tau_1$, and is equal to approximately one hundred microseconds. The reason for this is that $\tau_1$, provides for the increased amount of time required for encoding while $\tau_2$ can be appropriately shortened to establish an efficient refocusing rate.

A consequence of the difference between $\tau_1$, and $\tau_2$ is that there is a need for a transition between the two phases. Accordingly, beginning at time $t_2$, immediately after the 180° refocusing pulse that ends the encoding phase, there is a transition delay which extends to time $t_3$ and the first 180° refocusing pulse of the recording phase. This transition delay is equal to $\tau_1 + \tau_2$.

During the recording phase, the now encoded material is repetitively refocused at an accelerated rate using 180° refocusing pulses. As indicated above, the interval between 180° refocusing pulses in the recording phase is $2\tau_2$.

Recall, the method of the present invention envisions groups of sequences, all of which follow the timing pattern set forth above. Further, as indicated above, within each sequence there are both 90° and 180° pulses which perform slightly different functions. First there is a 90° tilting pulse which starts each sequence. This is followed by a 180° pulse which initiates the encoding phase of the sequence. Then, following encode, there is a train of 180° refocusing pulses which are used to repetitively refocus the magnetic moments during the recording phase.

It happens that, in order to capture all components of the refocused magnetic moments during a group of sequences, the phase of the 180° pulse which initiates the encode and the phase of the 180° pulses in the train of pulses which follow the encode must differ in their relation to each other from sequence to sequence. This can be accomplished in several ways.

For example, in a preferred embodiment, all sequences in a group will begin with the same tilting pulse, namely a $90°_x$ tilting pulse. The 180° pulse which follows the tilting pulse and which initiates the encoding phase will, however, differ from sequence to sequence within a group of sequences. Specifically, for the first sequence a $180°_{+x}$ pulse is used, for the second sequence a $180°_{-x}$ pulse is used, for the third sequence a $180°_{+y}$ pulse is used, and for the fourth sequence a $180°_{-y}$ pulse is used. Then, in order to accomplish the relative phase shifts mentioned above, the train of 180° refocusing pulses in both the first and second sequences are the same, namely $180°_{+x}$, and the train of 180° refocusing pulses in both the third and fourth sequences are the same, namely $180°_{+y}$. Thus, in the sequences of every group there is a sequence with all $180°_{+x}$ pulses, a sequence with both $180°_{+x}$ and $180°_{-x}$ pulses, a sequence with all $180°_{+y}$ pulses, and a sequence with both $180°_{+y}$ and $180°_{-y}$ pulses.

It is to be appreciated that in an alternate embodiment of the present invention, the phase differences between the 180° pulses can be accomplished differently from the scheme disclosed above. Specifically, rather than sequentially changing the phase of the 180° pulse which initiates the encode, the 180° pulses in the train of pulses can be changed from sequence to sequence. In this alternate embodiment the sequences of a group are initiated respectively, in order, by a $180°_{+x}$, a $180°_{-x}$, a $180°_{+y}$, and a $180°_{-y}$ pulse. The first and second sequences are both then followed by a train of $180°_x$ pulses, and the third and fourth sequences are both followed by a train of $180°_y$ pulses.

Regardless of the particular composition of pulses in a sequence, additional imaging of the tissue, using more groups of pulses, is possible. Moreover, the methods of the present invention can be easily incorporated with techniques such as those disclosed in the earlier discussed U.S. Pat. No. 5,304,930.

BRIEF DESCRIPTION OF THE DRAWINGS

The novel features of this invention, as well as the invention itself, both as to its structure and its operation will be best understood from the accompanying drawings, taken in conjunction with the accompanying description, in which similar reference characters refer to similar parts, and in which.

DESCRIPTION OF THE PREFERRED EMBODIMENT

Figure 1A:
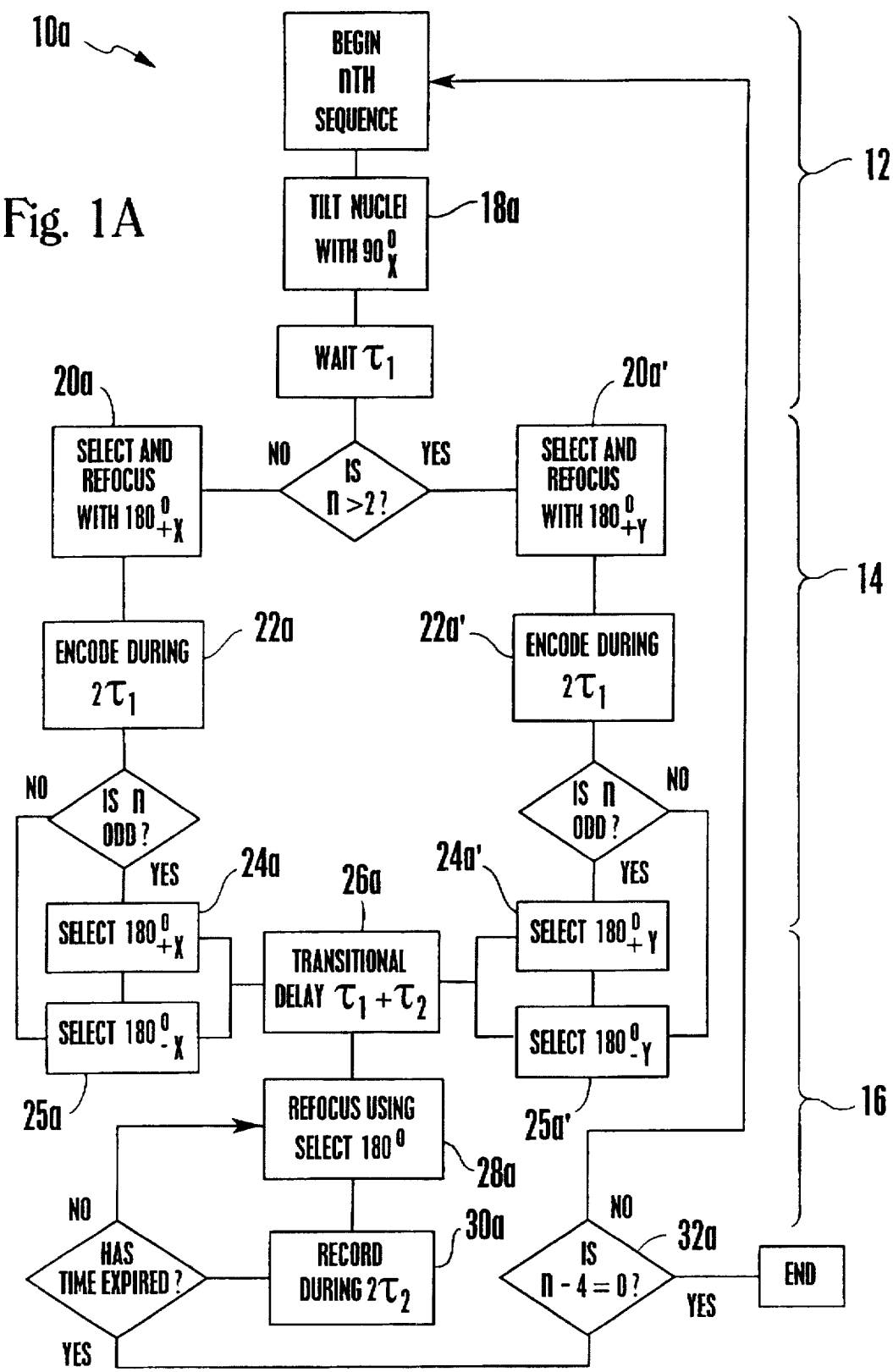
FIG. 1A is a flow chart of the steps included in the methods of the present invention.

Referring initially to FIG. 1A, a flow chart of the steps involved in practicing the methods of the present invention is shown and generally designated 10a. In overview, chart 10a indicates that the methods of the present invention include three functional phases. Namely, these phases are the "tilting" phase 12, the "encoding" phase 14 and the "recording" phase 16. As indicated above, these functional phases 12, 14 and 16 are typical for most MRI procedures which use a nonhomogeneous magnetic field. For the present invention, however, the functional phases 12, 14 and 16 have distinctly definable characteristics and are temporally related in a specific way.

Block 18a of chart 10a indicates that, according to the methods of the present invention, each sequence in a group of sequences begins with the tilting of the nuclei by a $90°_x$ pulse. After the nuclei are tilted there is a wait for a duration $t_1$. After the wait for $\tau_1$, blocks 20a and 20a' indicate that a 180° refocusing pulse is selected. Depending on whether it is the first/second sequence, or the third/fourth sequence, the refocusing pulse can be either a $180°_{+x}$(block 20a) or a $180°_{+y}$(block 20a') refocusing pulse. Blocks 22a and 22a'then indicate the encode operation occurs during a time duration equal to $2\tau_1$. This encode can be accomplished using gradient coils (not shown) in a manner well known in the pertinent art.

After the encoding phase 14, blocks 24a and 25a respectively indicate that for the first sequence of recording phase 16 a $180°_{30,x}$refocusing pulse is selected (block 24a), and for the second sequence of recording phase 16 a $180°_{-x}$ refocusing pulse is selected (block 25a). Similarly, for the third sequence of recording phase 16 a $180°_{+y}$ refocusing pulse is selected (block 24a'), and for the fourth sequence of recording phase 19 a $180°_{-y}$ refocusing pulse is used. In each case, as indicated by block 26a there is a delay of $\tau_1+\tau_2$ before the actual recording begins.

Blocks 28a and 30a indicate that the recording of spin echos is accomplished in the recording phase 16 during a $2\tau_2$ time interval which is established between the appropriately selected 180° refocusing pulses. Block 32a indicates that there are necessarily four sequences in the group. For purposes of the present invention, the process indicated by chart 10a for a group of sequences can be repeated as many time as desired by the operator.

Figure 1B:
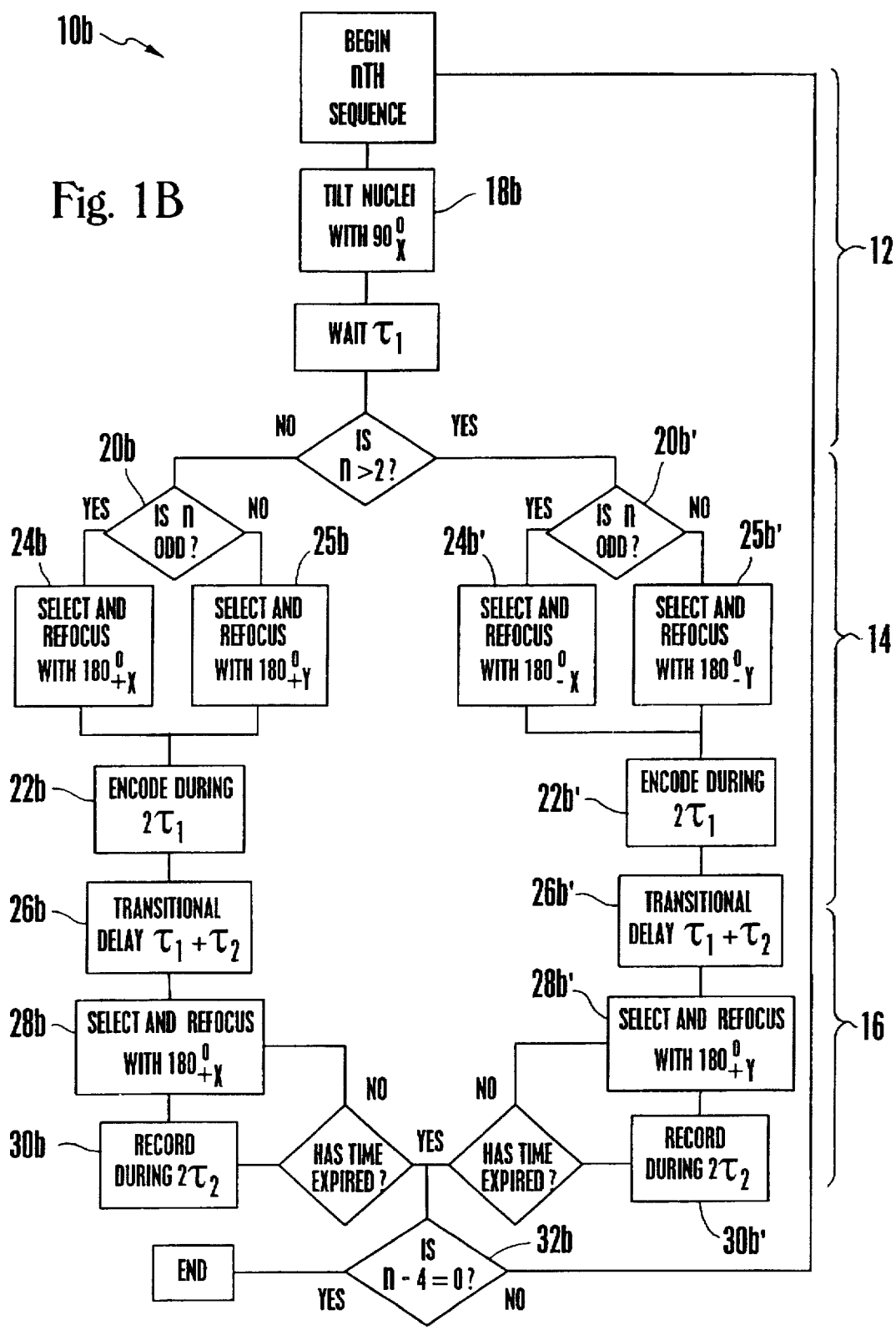
FIG. 1B is a flow chart of the steps included in an alternate method of the present invention.

With reference to FIG. 1B, it will be appreciated that the different shifts in the 180° refocusing pulse can be set up in a slightly different manner than as shown for the method depicted in FIG. 1A. Specifically, in FIG. 1B it will be seen that after the initial 90° tilting pulse (block 18b), the initial 180° refocusing pulse for each sequence is changed. Referring to blocks 20b and 24b, it will be seen that for the first sequence this refocusing pulse is a 180°$_{+x}$ pulse. Blocks 20b and 25b indicate that for the second sequence this refocusing pulse is a 180°$_{-x}$ refocusing pulse. Similarly, blocks 20b' and 24b' indicate that for the third sequence the refocusing pulse is a 180°$_{+y}$ pulse, and blocks 20b' and 25b' indicate that for the fourth sequence this refocusing pulse is a 180°$_{-y}$ pulse. In each case, there is an encode during the time interval $2\tau_1$ immediately following the initial 180° refocusing pulse (blocks 22b and 22b').

Collectively, blocks 26b, 28b and 30b indicate that during the recording phase 16, in both the first and second sequences of the alternate method, a 180°$_{+x}$ refocusing pulse is used. Also, blocks 26b', 28b' and 30b' indicate that in both the third and fourth sequences of the alternate method, a 180°$_{+y}$ refocusing pulse is used. Block 32b next indicates that there are four sequence in each group. As before, any number of groups can be performed according to the desires of the operator.

It is to be appreciated that in the methods described above, 180°$_x$ pulses are interchangeable with 180°$_y$ pulses, and plus (+) pulses are interchangeable with negative (−) pulses. The important consideration is that the sequence of x and y and + and − pulses be presented in the order discussed above.

Figure 2:
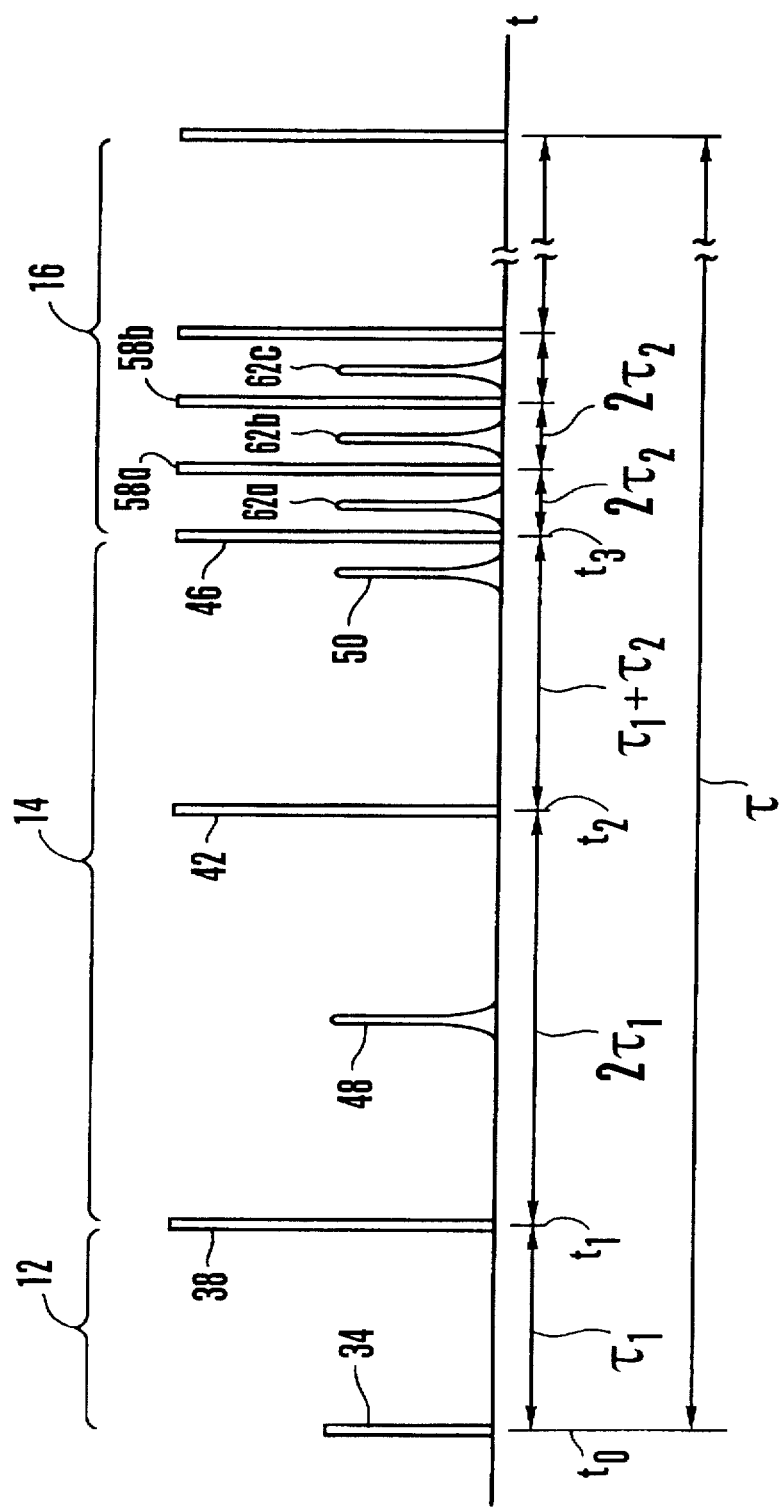
FIG. 2 is a time line showing the temporal relationship between pulses in a sequence of pulses according to the methods of the present invention.

By cross-referencing FIGS. 1A and 1B with FIG. 2, it will be appreciated that a sequence in the methods of the present invention begins, as indicated at block 18 of charts 10a or 10b, with a 90°$_x$ tilting pulse 34. FIG. 2 indicates that the 90°$_x$ tilting pulse 34 occurs at time $t_0$. Referring specifically to FIG. 2, it can be seen that the tilting phase 12 ends at $t_1$ when the tissue being imaged by the method of the present invention is irradiated with a 180° refocusing pulse 38. This action is indicated by block 40 in chart 10 and begins the encoding phase 14.

FIG. 2 shows there is a time interval of $2\tau_1$ between the first 180° refocusing pulse 38 at $t_1$ and a second 180° refocusing pulse 42 at $t_2$. Block 44 of chart 10 indicates that it is during this time interval of $2\tau_1$ that the tissue being imaged is actually encoded. In a manner well known in the art, the tissue can be subjected to both an x gradient and a y gradient for this encoding. As is specifically appreciated by the present invention, however, a much longer time interval is required for efficient encoding of the tissue $(2\tau_1)$, than is required to maintain coherence of the tissue during the recording of spin echos $(2\tau^2)$. Nevertheless, both encoding and recording are necessary. Consequently, the present invention employs a timing mechanism for the transition from an encoding phase 14 to a recording phase 16. Specifically, this transitional delay occurs between the 180° refocusing pulse 42 at time $t_2$ and a 180° refocusing pulse 46 time $t_3$. The transitional delay is equal to $\tau_1+\tau_2$.

The reason the transitional delay between encode phase 14 and record phase 16 is equal to $\tau_1+\tau_2$ is rather straightforward. Note in FIG. 2 that between the 180° refocusing pulse 38 at time $t_1$ and the 180° refocusing pulse 42 at time $t_2$ there is a spin echo 48. This spin echo 48 occurs for the following reasons. At time to the tissue being imaged was initially tilted with the 90° tilting pulse 34. It happened, however, that due to the field gradient $G_x$ the nuclei immediately began to defocus when they were tilted. The 180° refocusing pulse 38 at time $t_1$ reversed this trend and began to refocus the nuclei. Because $\tau_1$ time had elapsed before refocusing began, the nuclei required another time lapse of $\tau_1$ in order to be completely refocused. The spin echo 48 is the result of this refocusing. It does not stop there, however, as the nuclei immediately begin to defocus again after creating the spin echo 48. Therefore, as indicated by block 52 in chart 10, another refocusing is required. This occurs at time $t_2$ with the 180° refocusing pulse 42 and results in the spin echo 50 which occurs at a time interval $\tau_1$ after $t_2$. This mechanism of focus/defocus/refocus could go on and on, however, it happens as mentioned above that a much longer time interval is required for efficient encoding of the tissue $(2\tau_1)$, than is required to maintain coherence of the tissue during the recording of spin echos $(2\tau_2)$. Accordingly, the focus/defocus/refocus mechanism is accelerated. Indeed, whereas $t_1$ is generally equal to approximately one millisecond, $\tau_2$ is chosen to be approximately equal to around one hundred micro seconds.

Block 54 of chart 10 in FIG. 1 indicates there is a transitional delay of $\tau_1\tau_2$ which is taken after the tissue has been encoded between $t_1$ and $t_2$ but before the recording phase 16 begins. Note that in line with the above discussion, the spin echo 50 occurs $\tau_1$ after $t_2$ and that the nuclei will immediately begin to defocus after creating spin echo 50. Since the nuclei have already been encoded, an accelerated refocusing rate is now possible. Accordingly, the nuclei which defocus after having created spin echo 50 are irradiated with the 180° refocusing pulse 46 after a time interval of only $\tau_2$. This action is indicated respectively at blocks 28a and 28b in charts 10a and 10b. Thereafter, subsequent 180° refocusing pulses 58 a, b, et. seq. are used at interval of $2\tau_2$ to refocus the nuclei and maintain their coherence for recording purposes. Specifically, at the middle of each $2\tau_2$ interval an encoded spin echo 62 is created which can be recorded in a manner well known in the pertinent art. The spin echos 62a, 62b and 62c are exemplary. This action is indicated respectively at blocks 30a and 30b in charts 10a and 10b.

According to charts 10a and 10b, and as implied above, once time has expired using a particular 180° refocusing pulse another 180° refocusing pulse is used until four sequences each using respectively a particular 180°$_{(\pm x\ and\ \pm y)}$ have been used.

While the particular method for maintaining encoded coherence for a remotely positioned MRI device as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

What is claimed is:

1. A method for maintaining encoded coherence for a remotely positioned MRI device which comprises the steps of:

tilting the nuclear magnetic moments of a material with a 90° pulse;

pausing for a first time interval of $\tau_1$ immediately after said tilting step;

initially refocusing said tilted nuclear magnetic moments with a 180° pulse after said first time interval;

encoding said initially refocused nuclear magnetic moments by imposing a gradient onto said material during a second time interval $2\tau_1$, said gradient consisting of an x gradient and a y gradient;

ending said encoding step with a refocusing pulse;

transitionally refocusing said nuclear magnetic moments with a 180° pulse after a time interval of $\tau_1 + \tau_2$ following said encoding step;

repetitively refocusing said encoded nuclear magnetic moments with a serial plurality of 180° pulses at a pulse repetition rate having a third time interval separation between said sequenced 180° pulses of $2\tau_2$; and recording the magnetic moment measurements of said refocused nuclear magnetic moments after each 180° pulse in said serial plurality of 180° pulses.

2. A method as recited in claim 1 wherein said tilting step is initiated at a time $t_0$ and ends at a time $t_1$ with an elapsed time between to and $t_1$ equal to approximately $t_1$.

3. A method as recited in claim 2 wherein said encoding step is initiated at said time $t_1$ and ends at a time $t_2$ with an elapsed time between $t_1$ and $t_2$ equal to approximately $2\tau_1$.

4. A method as recited in claim 3 wherein said transitionally refocusing step begins at said time $t_2$ and ends at a time $t_3$ with an elapsed time between $t_2$ and $t_3$ equal to approximately $\tau_1 + \tau_2$.

5. A method as recited in claim 4 wherein said repetitively refocusing step is initiated at said time $t_3$ and said third time interval equals $2\tau_2$.

6. A method as recited in claim 5 wherein $\tau_1$ is in the range of from one half millisecond to ten milliseconds.

7. A method as recited in claim 5 wherein $\tau_1$ is greater than $\tau_2$.

8. A method as recited in claim 7 wherein $\tau_1$ equals approximately one millisecond ($\tau_1 = 1$ msec) and $\tau_2$ equals approximately one hundred microseconds ($\tau_2 = 100$ μsec).

9. A method as recited in claim 1 wherein said tilting step, said pausing step, said encoding step and said repetitively refocusing step establish a sequence, and wherein said method comprises a first sequence and a second sequence.

10. A method as recited in claim 9 wherein said 180° pulse of said initially refocusing step of said second sequence is phase shifted 90° from said 180° pulse of said initially refocusing step of said first sequence.

11. A method for maintaining encoded coherence for a remotely positioned MRI device which comprises the steps of:

tilting the nuclear magnetic moments of a material with a 90° pulse at a time $t_0$;

refocusing the nuclear magnetic moments with a 180° pulse at a time $t_1$, said time $t_1$ being at a time interval $\tau_1$ after said time $t_0$;

encoding said tilted nuclei by imposing a gradient to said material, said gradient consisting of an x gradient and a y gradient, and said encoding step being accomplished during a time interval of $2\tau_1$, with $2\tau_1$ being equal to the time between said time $t_1$, and a time $t_2$;

refocusing the nuclear magnetic moments with a 180° pulse at said time $t_2$;

refocusing the nuclear magnetic moments with a 180° pulse at a time $t_3$, said time $t_3$ being at a time interval equal to $\tau_1$ plus $\tau_2$ after said time $t_2$; and repetitively refocusing said tilted nuclear magnetic moments with a train of 180° pulses, said train having a plurality of said 180° pulses and a predetermined pulse repetition rate; and recording the magnetic moment measurements of said refocused nuclei after each 180° pulse in said train.

12. A method as recited in claim 11 wherein said train of 180° pulses is a serial plurality of said 180° pulses.

13. A method as recited in claim 11 wherein said predetermined pulse repetition rate is characterized by a time interval between individual said 180° pulses equal to $2\tau_2$.

14. A method as recited in claim 11 wherein $\tau_1$ is greater than $\tau_2$.

15. A method as recited in claim 11 wherein $\tau_1$ is in the range of from one half millisecond to ten milliseconds.

16. A method as recited in claim 11 wherein $\tau_1$ equals approximately one millisecond ($\tau_1 = 1$ msec) and $\tau_2$ equals approximately one hundred microseconds ($\tau_2 = 100$ μsec).

17. A method as recited in claim 11 wherein said tilting step, said encoding step and said repetitively refocusing step establish a sequence, and wherein said method comprises a first sequence and a second sequence.

18. A method as recited in claim 17 wherein said 180° pulse of said refocusing step of said second sequence is phase shifted 90° from said 180° pulse of said refocusing step of said first sequence.

19. A method for using refocusing pulses to maintain encoded coherence for a remotely positioned MRI device which comprises the steps of:

establishing an encoding phase having sufficient duration to permit the encoding of refocused nuclear magnetic moments of a material, said encoding phase being equal to a time interval of $2\tau_1$ between refocusing pulses;

transitioning from said encoding Phase with a refocusing pulse after a time interval equal to $\tau_1 + \tau_2$; and using a recording phase after said transitioning step and following said encoding phase to record repetitively refocused encoded nuclear magnetic moments, said recording phase being equal to a time interval of $2\tau_2$, where $\tau_1$ is of greater duration than $\tau_2$.

* * * * *